(12) United States Patent
Balakrishnan et al.

(10) Patent No.: US 9,837,406 B1
(45) Date of Patent: Dec. 5, 2017

(54) III-V FINFET DEVICES HAVING MULTIPLE THRESHOLD VOLTAGES

(71) Applicant: International Business Machines Corporation, Armonk, NY (US)

(72) Inventors: Karthik Balakrishnan, White Plains, NY (US); Pouya Hashemi, White Plains, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/255,594

(22) Filed: Sep. 2, 2016

(51) Int. Cl.
| | | |
|---|---|---|
| *H01L 27/088* | (2006.01) | |
| *H01L 21/8252* | (2006.01) | |
| *H01L 29/20* | (2006.01) | |
| *H01L 21/02* | (2006.01) | |

(52) U.S. Cl.
CPC .... *H01L 27/0886* (2013.01); *H01L 21/02461* (2013.01); *H01L 21/02463* (2013.01); *H01L 21/02505* (2013.01); *H01L 21/02546* (2013.01); *H01L 21/8252* (2013.01); *H01L 29/20* (2013.01)

(58) Field of Classification Search
CPC ............... H01L 27/0886; H01L 21/02461
See application file for complete search history.

(56) References Cited

U.S. PATENT DOCUMENTS

| | | |
|---|---|---|
| 6,492,212 B1 | 12/2002 | Ieong et al. |
| 7,906,802 B2 | 3/2011 | Baumgartner et al. |
| 8,105,901 B2 | 1/2012 | Cheng et al. |
| 8,324,036 B2 | 12/2012 | Cheng et al. |
| 8,735,232 B2 | 5/2014 | Baars et al. |
| 8,941,214 B2 | 1/2015 | Sell |
| 9,337,109 B2 | 5/2016 | Doornbos et al. |

(Continued)

FOREIGN PATENT DOCUMENTS

| | | |
|---|---|---|
| KR | 100680972 B1 | 2/2007 |
| TW | 201126615 A | 8/2011 |

OTHER PUBLICATIONS

A. Vardi et al., "Quantum-Size Effects in Sub 10-nm Fin Width InGaAs FinFETs," IEEE International Electron Meeting (IEDM), Dec. 2015, pp. 31.3.1-31.3.4.

*Primary Examiner* — Caleb Henry
*Assistant Examiner* — Mounir Amer
(74) *Attorney, Agent, or Firm* — Louis J. Percello; Ryan, Mason & Lewis, LLP

(57) ABSTRACT

Semiconductor devices are provided which comprise III-V FINFET devices that are formed with different semiconductor fin widths to obtain different threshold voltages, as well as methods for fabricating such III-V FINFET devices. For example, a semiconductor device comprises first and second semiconductor fins, which are formed of a III-V compound semiconductor material, and which have a first width W1 and a second width W2, respectively, wherein W1 is less than W2. First and second gate structures of first and second FINFET devices are formed over a portion of the first and second semiconductor fins, respectively. The first FINFET device comprises a first threshold voltage and the second FINFET device comprises a second threshold voltage. The first threshold voltage is greater than the second threshold voltage as a result of the first width W1 being less than the second width W2.

12 Claims, 7 Drawing Sheets

(56) References Cited

U.S. PATENT DOCUMENTS

| | | |
|---|---|---|
| 2008/0303095 A1 | 12/2008 | Xiong et al. |
| 2010/0187575 A1 | 7/2010 | Baumgartner et al. |
| 2013/0185527 A1* | 7/2013 | Puckett .................... G11C 8/12 |
| | | 711/154 |
| 2014/0001519 A1* | 1/2014 | Dewey .............. H01L 29/66795 |
| | | 257/288 |
| 2015/0145042 A1* | 5/2015 | Bu ....................... H01L 27/1211 |
| | | 257/347 |

* cited by examiner

US 9,837,406 B1

III-V FINFET DEVICES HAVING MULTIPLE THRESHOLD VOLTAGES

TECHNICAL FIELD

This disclosure generally relates to semiconductor fabrication techniques and, in particular, to structures and methods for fabricating FET (field effect transistor) devices.

BACKGROUND

As semiconductor manufacturing technology continues to evolve toward smaller design rules and higher integration densities (e.g., 14 nm technology node and beyond), integrated circuit devices and components become increasingly smaller, creating challenges in layout formation and device optimization. One type of integrated circuit device which provides effective CMOS scaling solutions for FET fabrication at, and below, the 14 nm technology node includes fin-shaped FET devices (referred to as FINFET). A FINFET is a three-dimensional transistor structure which comprises at least one vertical semiconductor fin structure formed on a substrate, a gate structure formed over a portion of the vertical semiconductor fin, and source/drain regions formed by portions of the vertical semiconductor fin extending from both sides of the gate structure. The portion of the vertical semiconductor fin that is covered by the gate structure between the source/drain regions comprises a device channel region of the FINFET device.

As with all FET technologies, different semiconductor FET devices within a given integrated circuit may be fabricated with different device characteristics, such as switching speed, leakage power consumption, etc., to optimize the operating characteristics the FET devices for target functions or applications. For instance, one design may increase switching speed for FET devices providing computational logic functions, and another design may decrease power consumption for FET devices providing memory storage functions. It is known in the art that modifying a threshold voltage (Vt) of an FET device can enhance performance characteristics of the FET devices for certain applications. Conventional approaches for modifying a threshold voltage of FET devices include doping portions of the device to enhance channel mobility, or other techniques that involve extra process steps such as masking, lithography and etching, which can complicate fabrication and consume time and resources.

SUMMARY

Embodiments of the invention generally include semiconductor devices comprising III-V FINFET devices that are formed with different semiconductor fin widths to obtain different threshold voltages, as well as methods for fabricating III-V FINFET devices with different semiconductor fin widths to obtain different threshold voltages.

For example, one embodiment of the invention includes a semiconductor device. The semiconductor device comprises a plurality of vertical semiconductor fins formed on a semiconductor substrate. The plurality of vertical semiconductor fins includes a first vertical semiconductor fin and a second vertical semiconductor fin. The first and second vertical semiconductor fins are formed of a III-V compound semiconductor material. The first semiconductor fin comprises a first width W1, and the second semiconductor fin comprises a second width W2, wherein W1 is less than W2. A first gate structure of a first FINFET device is formed over a portion of the first vertical semiconductor fin, and a second gate structure of a second FINFET device is formed over a portion of the second vertical semiconductor fin. The first FINFET device comprises a first threshold voltage and the second FINFET device comprises a second threshold voltage. The first threshold voltage is greater than the second threshold voltage as a result of the first width W1 being less than the second width W2.

Other embodiments will be described in the following detailed description of embodiments, which is to be read in conjunction with the accompanying figures.

BRIEF DESCRIPTION OF THE DRAWINGS

FIGS. 2 through 8 schematically illustrate a method for fabricating the semiconductor device of FIGS. 1A/1B, according to an embodiment of the invention, wherein:

FIG. 2 is cross-sectional schematic side view of the semiconductor device of FIG. 1A at an intermediate stage of fabrication starting with a semiconductor substrate comprising a base substrate layer, a buffer layer, and an active semiconductor layer;

FIG. 3 is cross-sectional schematic side view of the semiconductor device of FIG. 2 after patterning a portion of the active semiconductor layer of III-V semiconductor material in a first device to form a first vertical semiconductor fin having a first width W1;

FIG. 4 is cross-sectional schematic side view of the semiconductor device of FIG. 3 after patterning a portion of the active semiconductor layer of III-V semiconductor material in a second device region to form a second vertical semiconductor fin having a second width W2;

FIG. 5 is a cross-sectional schematic side view of the semiconductor structure of FIG. 4 after sequentially depositing a conformal layer of gate dielectric material and a conformal layer of work function metal over the first and second vertical semiconductor fins in the first and second device regions;

FIG. 6 is a cross-sectional schematic side view of the semiconductor structure of FIG. 5 after depositing and planarizing a layer of metallic material to form metal gate electrodes of the FINFET devices;

FIG. 7 is a cross-sectional schematic side view of the semiconductor structure of FIG. 6 after etching an opening through the layer of metallic material, the conformal work function metal and dielectric layers, and an upper portion of the buffer layer, to form a shallow trench in the buffer layer; and FIG. 8 is a cross-sectional schematic side view of the semiconductor structure of FIG. 7 after depositing a layer of insulating material fill the shallow trench in the buffer layer with the insulating material.

DETAILED DESCRIPTION

Figure 1A:
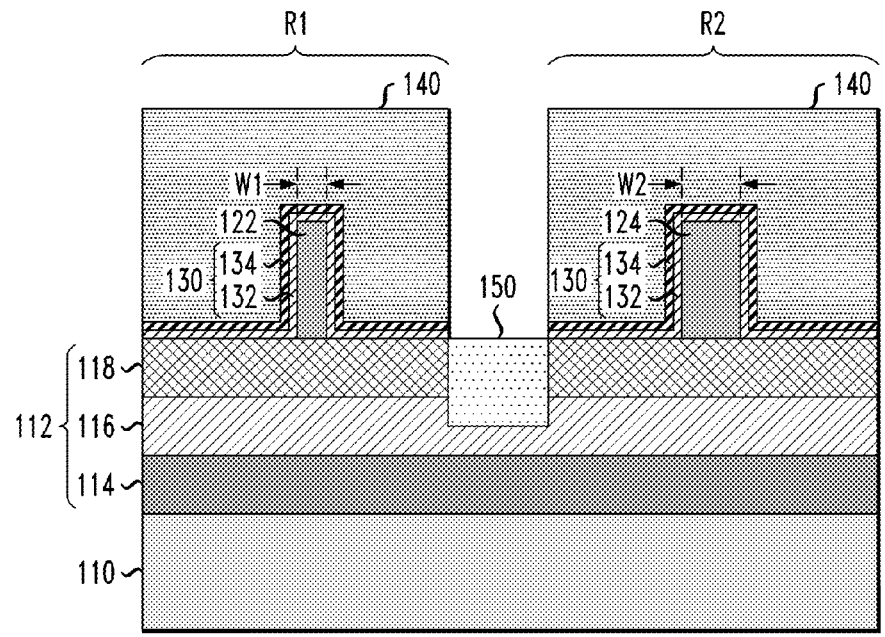
FIGS. 1A and 1B schematically illustrate a semiconductor device comprising III-V FINFET devices that are formed with different semiconductor fin widths to obtain different threshold voltages, according to an embodiment of the invention.

Embodiments of the invention will now be discussed in further detail with regard to semiconductor devices comprising III-V FINFET devices that are formed with different semiconductor fin widths to obtain different threshold voltages, as well as methods for fabricating III-V FINFET devices with different semiconductor fin widths to obtain different threshold voltages. As explained in further detail below, III-V FINFET devices with different threshold voltages are fabricated by modulating semiconductor fin width of the devices, wherein FINFET devices having narrower semiconductor fins formed of a III-V compound semiconductor material provide higher threshold voltage devices, whereas FINFET devices having thicker semiconductor fins formed of the same III-V compound semiconductor material provide lower threshold voltage devices. It is to be understood that the term "III-V compound semiconductor" as used herein refers to a semiconductor material which comprises at least one element from each of Group III and Group V of the periodic table of elements. Examples of III-V compound semiconductors include, but are not limited to, GaAs (Gallium Arsenide), InP (Indium Phosphide), InAlAs (Indium Aluminum Arsenide), InGaAs (Indium Gallium Arsenide), InAs (Indium Arsenide), GaP (Gallium Phosphide), InSb (Indium Antimonide), GaSb (Gallium Antimonide), GaN (Gallium Nitride), and AlInP (Aluminum Indium Phosphide).

It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount.

Figure 1B:
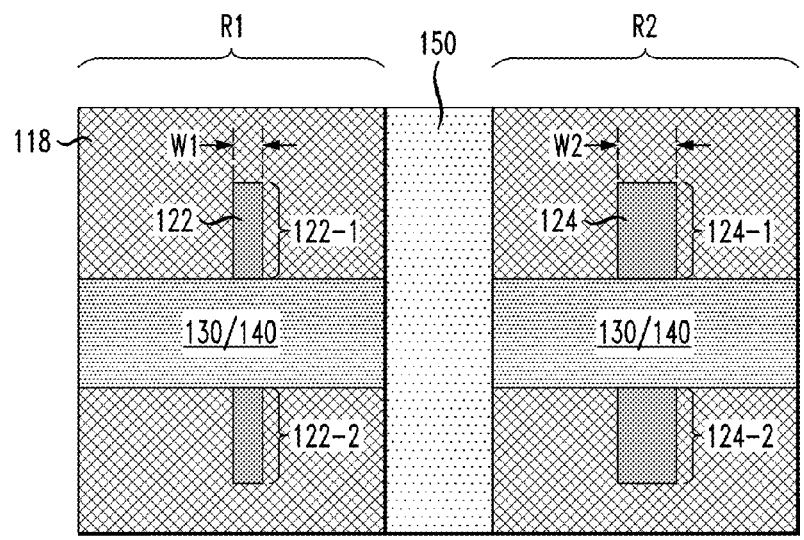

FIGS. 1A and 1B schematically illustrate a semiconductor device comprising III-V FINFET devices that are formed with different semiconductor fin widths to obtain different threshold voltages, according to an embodiment of the invention. In particular, FIG. 1A is a schematic cross-sectional view of the semiconductor device 100 in an X-Z plane, as indicated by the XYZ Cartesian coordinates shown in FIG. 1A. In addition, FIG. 1B is a top plan view of the semiconductor device 100 in an X-Y plane as indicated by the XYZ Cartesian coordinates shown in FIG. 1B. It is to be understood that the terms "vertical" or "vertical direction" as used herein denotes a Z-direction of the Cartesian coordinates shown in FIGS. 1A/1B, and that the terms "horizontal" or "horizontal direction" as used herein denotes an X-direction and/or Y-direction of the Cartesian coordinates shown in FIGS. 1A/1B, which is perpendicular to the Z-direction.

As shown in FIGS. 1A/1B, the semiconductor device 100 comprises a base semiconductor substrate 110, and a buffer layer 112 comprising a stack of layers 114, 116 and 118 of different III-V compound semiconductor materials formed on the base semiconductor substrate 110. A first vertical semiconductor fin 122 is formed in a first device region R1 of the semiconductor device 100, and a second vertical semiconductor fin 124 is formed in a second device region R2 of the semiconductor device. In one embodiment of the invention, the vertical semiconductor fins 122 and 124 are formed of a III-V compound semiconductor material. As explained in further detail below with reference to FIG. 2, the vertical semiconductor fins 122 and 124 are patterned from an active semiconductor layer of III-V material (layer 120, FIG. 2) which is epitaxially grown on the buffer layer 112.

Each device region R1 and R2 comprises at least one FINFET device. In the first device region R1, the FINFET device comprises the first vertical semiconductor fin 122, and a gate structure 130/140 formed over a portion of the first vertical semiconductor fin 122. Similarly, in the second device region R2, the FINFET device comprises the second vertical semiconductor fin 124, and a gate structure 130/140 formed over a portion of the second vertical semiconductor fin 124. Each gate structure 130/140 comprises a high-k metal gate stack structure 130 conformally formed over a portion of the vertical semiconductor fins 122 and 124, and a metal gate electrode layer 140 formed over the high-k metal gate stack structure 130. Each high-k metal gate stack structure comprises a conformal high-k gate dielectric layer 132 formed over the vertical semiconductor fins 122 and 124, and a conformal work function metal layer 134 formed over the conformal high-k gate dielectric layer 132.

As shown in FIG. 1B, portions 122-1 and 122-2 of the first vertical semiconductor fin 122, which extend from sidewalls of the gate structure 130/140 in the first device region R1, provide source/drain regions for the FINFET device in the first device region R1. Similarly, portions 124-1 and 124-2 of the second vertical semiconductor fin 124, which extend from sidewalls of the gate structure 130/140 in the second device region R2, provide source/drain regions for the FINFET device in the second device region R2. It is to be understood that the term "source/drain region" as used herein means that a given source/drain region can be either a source region or a drain region, depending on the application. For example, in one embodiment, the portions 122-1 and 124-1 of the vertical semiconductor fins 122 and 124 can be source regions, while the portions 122-2 and 124-2 of the vertical semiconductor fins 122 and 124 can be drain regions, and vice versa.

The source/drain regions 122-1, 122-2, 124-1, and 124-2 are generically shown in FIG. 1B for ease of illustration, but it is to be understood that the source/drain regions 122-1, 122-2, 124-1, and 124-2 can be formed using various methods and structures, for example, ion implanting P-type and N-type dopants into the exposed portions of the vertical semiconductor fins 122 and 124, or epitaxially growing additional layers of III-V semiconductor materials on the exposed portions of the vertical semiconductor fins 122 and 124 to form the source/drain regions, etc. The epitaxial source/drain regions can be doped using suitable dopants. In general, a group III-V compound semiconductor material can be N-doped using atoms such as Tellurium (Te), Selenium (Se), etc., or P-doped using atoms such as Beryllium (Be), Zinc (Zn), etc. In addition, a group III-V compound semiconductor material can also be doped using Si or Ge atoms as either donors or acceptors, depending on which element (group III or ground V) is replaced by the Si or Ge atoms.

The portions of the vertical semiconductor fins 122 and 124 which are covered by the gate structures 130/140 serve as channel regions for the FINFET devices. In accordance with embodiments of the invention, a fin width ($W_F$) of the vertical semiconductor fins 122 and 124 in the different device regions R1 and R2 is modulated to achieve FINFET devices with different threshold voltages (Vt) in the different device regions R1 and R2. For example, in the example embodiment shown in FIGS. 1A/1B the first vertical semiconductor fin 122 is formed with a fin width of W1, and the second vertical semiconductor fin 124 is formed with a fin width of W2, wherein W2>W1. In accordance with embodiments of the invention, when the vertical semiconductor fins 122 and 124 are formed of a III-V compound semiconductor material (e.g., InGaAs), the fin width $W_F$ is made narrower to achieve a higher Vt FINFET device, whereas the fin width $W_F$ is made wider to achieve a lower Vt FINFET device. As will explained in further detail below with reference to FIG. 10, when a vertical semiconductor fin of a FINFET device is formed of certain III-V compound semiconductor materials, the threshold voltage Vt becomes highly sensitive to semiconductor fin widths $W_F$ that are less than 10 nm.

As further shown in FIGS. 1A/1B, a STI (shallow trench isolation) region 150 is formed in at least an upper portion of the buffer layer 112 to electrically isolate the device regions R1 and R2. While FIGS. 1A and 1B illustrate the STI region 150 formed between the device regions R1 and R2, it is to be understood that STI regions would be formed in other regions of the semiconductor device to isolate FINFET devices and other active components, which are formed in other active device regions of the semiconductor device 100 as part of a FEOL (front end of line) process that is performed to fabricate the integrated circuitry for a target application.

It is to be understood that for ease of illustration and discussion, FIGS. 1A/1B show a single FINFET device formed in each device region R1 and R2. However, the semiconductor device 100 may comprise other active and/or components formed in the device regions R1 and R2. Moreover, while each FINFET device is shown as comprising one vertical semiconductor fin (e.g., semiconductor fins 122 and 124), in other embodiments of the invention, a FINFET device can include a plurality of vertical semiconductor fins that are connected to a common gate structure to provide additional channel segments to increase the drive current of the FINFET device.

Moreover, although not specifically shown in FIGS. 1A/1B, the semiconductor device 100 would further comprise an insulating layer (e.g., insulating sidewall spacers and a capping layer) covering the sidewall and upper surfaces of the gate structures 130/140 of the FINFET devices, and a PMD (pre-metal dielectric) layer that is formed as part of a MOL (middle of the line) layer to further encapsulate the gate structures 130/140 and the source/drain regions 122-1, 122-2, 124-1 and 124-2 in an insulating material such as, for example, silicon oxide, silicon nitride, hydrogenated silicon carbon oxide, silicon based low-k dielectrics, porous dielectrics, or organic dielectrics including porous organic dielectrics, ULK (ultra-low-k) dielectrics, etc. Moreover, a plurality of vertical device contacts would be formed in the PMD layer to form contacts to the source/drain regions 122-1, 122-2, 124-1 and 124-2 and the metal gate electrode layers 140 of the FINFET devices.

Figure 2:
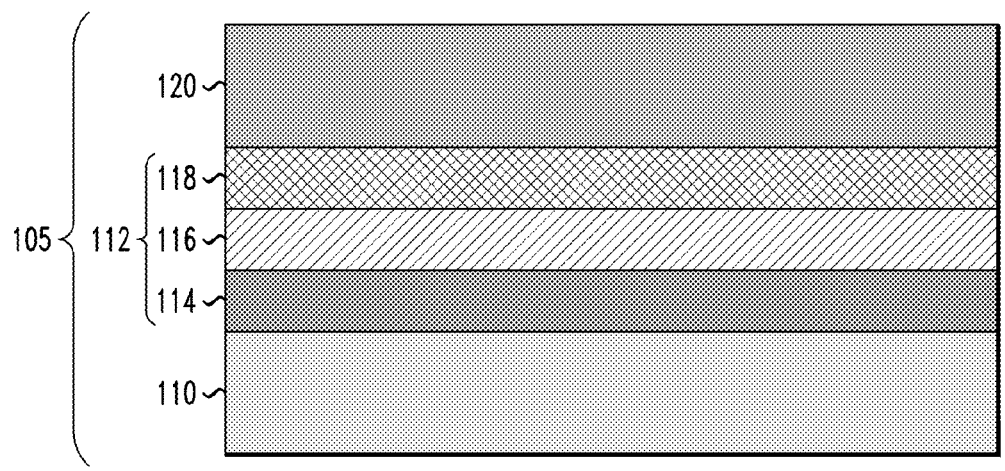

Methods for fabricating semiconductor device 100 of FIGS. 1A/1B will now be discussed in further detail with reference to FIGS. 2 through 8, which schematically illustrate the semiconductor device 100 at different stages of fabrication. To begin, FIG. 2 is cross-sectional schematic side view of the semiconductor device 100 of FIG. 1A at an intermediate stage of fabrication starting with a semiconductor substrate 105 comprising a base substrate layer 110, a buffer layer 112, and an active semiconductor layer 120. The buffer layer 112 comprises a multilayer stack of III-V semiconductor materials 114/116/118 formed on the base semiconductor substrate 110. In one embodiment, the base substrate 110 comprises bulk semiconductor substrate formed of one or more materials, including, but not limited to, silicon (S), germanium (Ge), silicon-germanium (SiGe), a III-V compound semiconductor material such InP, GaAs, InAs, InGaAs, or other types of compound semiconductor materials that are commonly used in bulk semiconductor fabrication processes, and which are suitable for the given application.

Furthermore, in one example embodiment, buffer layer 112 comprises a first III-V compound semiconductor layer 114, a second III-V compound semiconductor layer 116, and a third III-V compound semiconductor layer 118, which are formed of different III-V compound semiconductor materials. Further, in one embodiment of the invention, the active semiconductor layer 120 is formed of a III-V compound semiconductor material such as InGaAs. The active semiconductor layer 120 is patterned to form the vertical semiconductor fins 122 and 124 for the FINFET devices in subsequent processing steps. The use of a III-V compound semiconductor material to fabricate the vertical semiconductor fins 122 and 124 provides a higher carrier mobility than silicon and, therefore, allows for the fabrication of high-speed and high-performance semiconductor FINFET devices. The various layers of III-V compound semiconductor material (114, 116, 118, 120) can be epitaxially grown using known techniques, such as CVD (chemical vapor deposition), MOCVD (metal-organic CVD), LPCVD (Low Pressure CVD) or other known epitaxial growth techniques such as, for example, MOCVD (metal-organic chemical vapor deposition), MBE (molecular beam epitaxy), VPE (vapor-phase epitaxy), MOMBE (metallorganic molecular beam epitaxy), or other known epitaxial growth techniques.

In one embodiment of the invention, the buffer layer 112 provides a relaxed graded multilayer buffer structure that serves to effectively match the lattice constant of the material (e.g., Si, Ge) of the base semiconductor substrate 110 to the lattice constant of the compound semiconductor material of the active semiconductor layer 120 (e.g., active device layer). In other words, buffer layer 112 serves to minimize mechanical strain that would otherwise exist if the active semiconductor layer 120 of III-V compound semiconductor material (which is used to form the vertical semiconductor fins 122 and 124) was formed directly on the surface of the base semiconductor substrate 110 due to the lattice mismatch between the materials of the base semiconductor substrate 110 and the active semiconductor layer 120.

In this regard, the first layer 114 is preferably formed of a III-V compound semiconductor material that has a lattice constant which is different from, but closely matched to, the lattice constant of the material of the base semiconductor substrate 110. Further, the second layer 116 is preferably formed of a III-V compound semiconductor material that has a lattice constant which is different from, but closely matched to, the lattice constant of the III-V compound semiconductor material of the first layer 114. Similarly, the third layer 118 is preferably formed of a III-V compound semiconductor material that has a lattice constant which is different from, but closely matched to, the lattice constant of the III-V compound semiconductor material of the second layer 116. Finally, the active semiconductor layer 120 is preferably formed of a III-V compound semiconductor material that has a lattice constant which is different from, but closely matched to, the lattice constant of the III-V compound semiconductor material of the third layer 118. For example, in one embodiment, the first layer 114 comprises a composition of GaAs, the second layer 116 comprises a composition of InP, the third layer 118 comprises a composition of InAlAs, and the active semiconductor layer 120 comprises a composition of InGaAs.

In this manner, the multilayer buffer 112 provides a relaxed buffer structure that serves to minimize mechanical stress resulting from the lattice mismatch between semiconductor substrate 110 and the active semiconductor layer 120. This allows the active semiconductor layer 120 to be epitaxially grown with minimal or no lattice defects in the III-V compound semiconductor material that is used to form the vertical semiconductor fins 122 and 124 of the FINFET devices.

Figure 3:
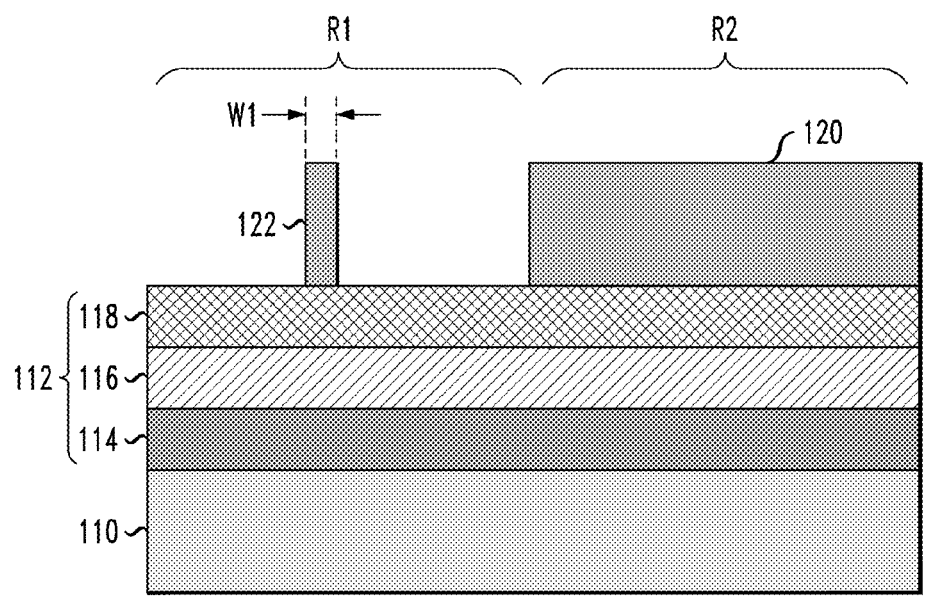
Figure 4:
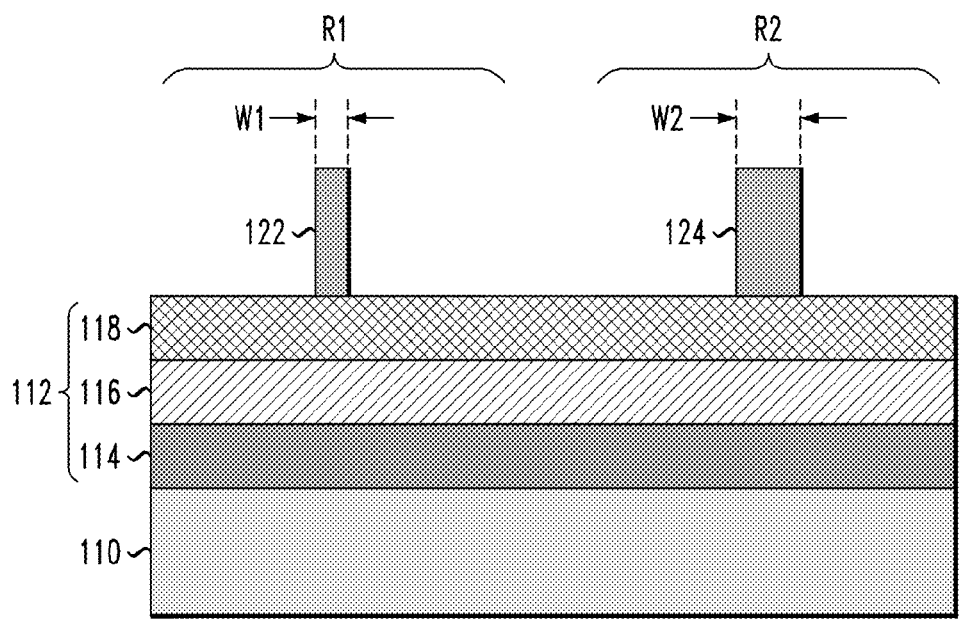

A next stage in the exemplary process flow comprises patterning the active semiconductor layer 120 to form a plurality of vertical semiconductor fins with different widths in the different device regions, using a process flow as schematically illustrated in FIGS. 3 and 4. In particular, FIG. 3 is cross-sectional schematic side view of the semiconductor device of FIG. 2 after patterning the active semiconductor layer 120 of III-V semiconductor material in the first device region R1 to form the first vertical semiconductor fin 122. As shown in FIG. 3, the first semiconductor fin 122 has a first width W1. With this process, an etch mask can be can be formed to cover the active semiconductor layer 120 in the second device region R2 and to pattern the exposed portion of the active semiconductor layer 120 in the first device region R1 to form the first vertical semiconductor fin 122. In one embodiment of the invention, the first vertical semiconductor fin 122 can be formed using a standard photolithographic patterning process including, but not limited to, a SIT (sidewall image transfer) photolithography process, as is known in the art. Other standard patterning methods can be used to form the first vertical semiconductor fin 122, the details of which are not necessary for understanding the invention.

Next, FIG. 4 is cross-sectional schematic side view of the semiconductor device of FIG. 3 after patterning the remaining portion of the active semiconductor layer 120 of III-V semiconductor material in the second device region R2 to form the second vertical semiconductor fin 124. As shown in FIG. 4, the second semiconductor fin 124 has a second width W2, which is greater than the first width W1 of the first vertical semiconductor fin 122 in the first device region R1. In one embodiment, the first width W1 is about 3 nm, and the second width W2 is in range of about 3.5 nm to about 4 nm. The second vertical semiconductor fin 1224 can be patterned using the same or similar photolithographic patterning methods as noted above, which are used to fabricate the first vertical semiconductor fin 122 in the first device region R1.

It is to be understood that while each device region R1 and R2 is shown to have one vertical semiconductor fin, the number of vertical semiconductor fins which are used to form a FINFET structure in each device region R1 and R2 can vary depending, depending on the application. For example, a FINFET device can be fabricated using one vertical semiconductor fin, or multiple semiconductor fins to increase the driving strength of the FINFET device, depending on the target application and integrated circuit layout. In one embodiment, the height (in vertical Z direction) of the vertical semiconductor fins 122 and 124 is in a range of 20 nm to about 80 nm, and a length (in the Y direction) of the vertical semiconductor fins 122 and 124 is in a range of about 50 nm to about 500 nm.

After forming the vertical semiconductor fins 122 and 124, the process flow continues with forming metal gate electrodes and other components of the FINFET devices in the device regions R1 and R2. The metal gate electrodes can be formed using various techniques known in the art. For example, the metal gate electrodes of the FINFET devices can be formed using a "gate-first" process or a "gate-last" process (alternatively referred to as a replacement metal gate (RMG) process). In a gate-first process, a gate structure (e.g., high-k metal gate stack structure, metal gate electrode, and associated gate insulating sidewall spacers and capping layer) are formed prior to a selective epitaxial growth process, for example, wherein epitaxial source/drain regions are formed on the exposed portions 122-1, 122-2, 124-1, and 124-2 of the vertical semiconductor fins 122 and 124 extending from the sidewalls of the gate structures 130/140 (as discussed above with reference to FIG. 1B).

In another embodiment, the high-k metal gate stack structure and metal gate electrode of the gate structures of the FINFET device can be formed using a "gate-last" process which involves, for example, forming dummy gate structures (e.g., polysilicon gates) between insulating gate sidewall spacers, fabricating other elements of the FINFET devices (e.g., epitaxial source/drain regions), removing the dummy gate structures, and replacing the removed dummy gate structures with a high-k metal gate stack structure and metal gate electrode between the insulating sidewall spacer. The dummy gate structures are sacrificial structures that are subsequently removed and replaced by a replacement metal gate (RMG) potentially including a gate dielectric layer, a work function metal layer, and a metal electrode. Because the RMG structures are formed after the other components of the FinFET devices are formed, the RMG structures are not subjected to various potentially damaging processing steps, for example high-temperature anneals.

Figure 5:
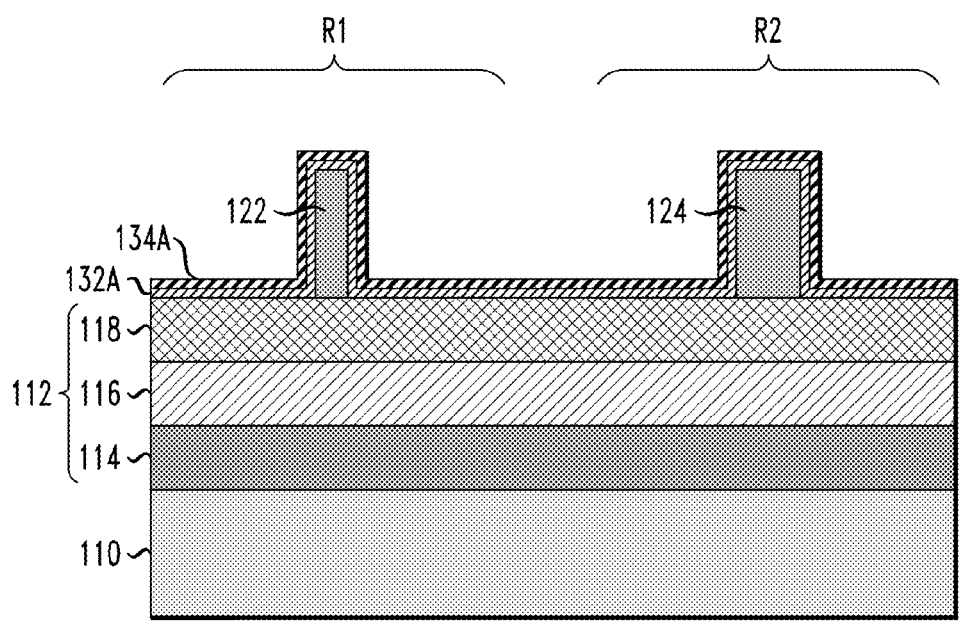

For illustrative purposes, the process flow schematically illustrated in FIGS. 5-8 shows a gate-first process, although embodiments of the invention can be implemented using a RMG process. In particular, FIG. 5 is a cross-sectional schematic side view of the semiconductor structure of FIG. 4 after sequentially depositing a conformal layer of gate dielectric material 132A and a conformal layer of work function metal 134A over the first and second vertical semiconductor fins 122 and 124 in the first and second device regions R1 and R2. The conformal layer of gate dielectric material 132A and the conformal layer of work function metal 134A are subsequently patterned to form the high-k metal gate stack structures 130 of the FINFET devices as shown in FIG. 1A.

The conformal layer of gate dielectric material 132A is formed, for example, by depositing one or more conformal layers of dielectric material over the structure of FIG. 4. The type of dielectric material(s) used to form the gate dielectric layer will vary depending on the application. For example, the conformal gate dielectric layer may comprise, e.g., nitride, oxynitride, or oxide or high-k materials such as, $HfO_2$, $HfSiO_4$, HfSiON, $ZrO_2$, $Al_2O_3$, $TiO_2$, $Ta_2O_5$ $La_2O_3$, $SrTiO_3$, $LaAlO_3$, and combinations thereof. In one embodiment of the invention, the conformal layer of gate dielectric material 132A is formed with a thickness in a range of about 0.5 nm to about 2.5 nm, which will vary depending on the target application. Further, the conformal layer of work function metal 134A may comprise one or more of, for example, Zr, W, Ta, Hf, Ti, Al, Ru, Pa, metal oxides, metal carbides, metal nitrides, transition metal aluminides (e.g. $Ti_3Al$, ZrAl), TaC, TiC, TaMgC, or any combination thereof. The conformal layers 132A and 134A are deposited using known methods such as ALD, CVD, or PVD, for example.

Figure 6:
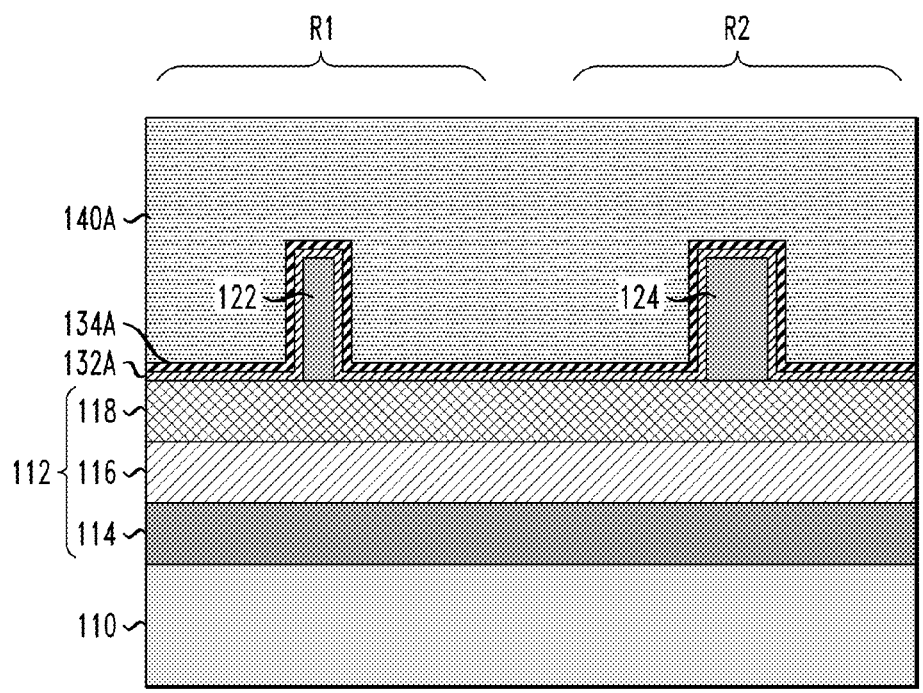

Next, FIG. 6 is a cross-sectional schematic side view of the semiconductor structure of FIG. 5 after depositing and planarizing a layer of metallic material 140A which is subsequently patterned to form the metal gate electrodes 140 of the FINFET devices. The metallic material 140A may be include a metallic material such as W, Al, Cu, or any metallic or conductive material that is commonly used to form gate electrode layers for FINFET devices.

Figure 7:
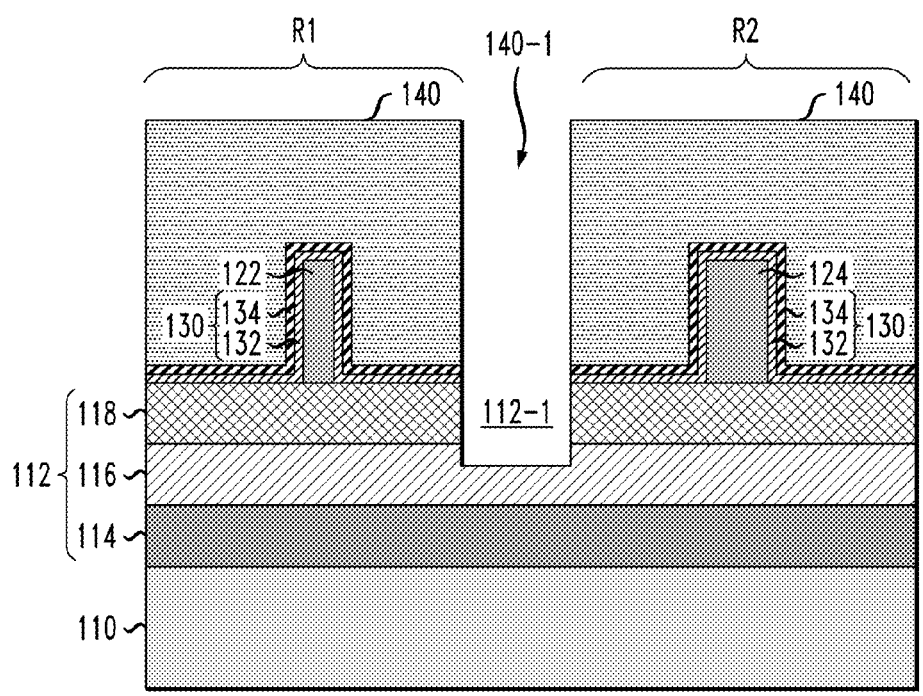
Figure 8:
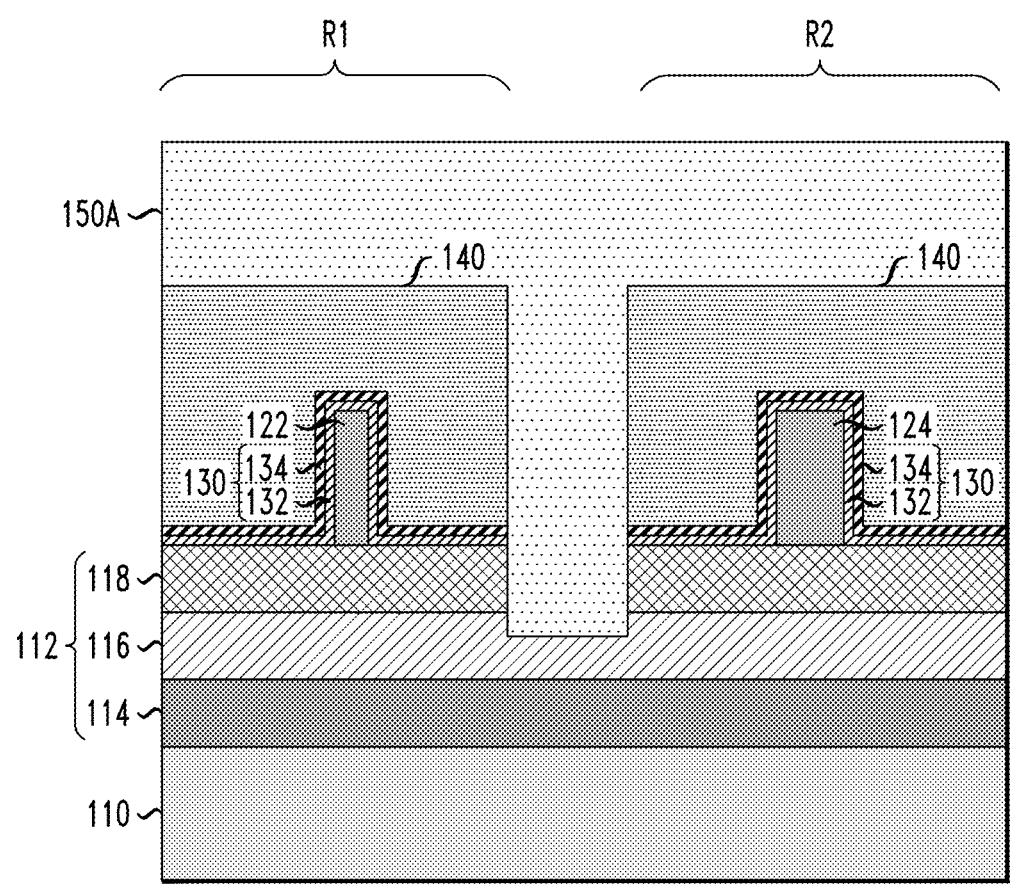

A next process module comprises forming the STI region 150 shown in FIGS. 1A/1B using a process flow as schematically illustrated in FIGS. 7 and 8. In particular, FIG. 7 is a cross-sectional schematic side view of the semiconductor structure of FIG. 6 after etching an opening 140-1 through the layer of metallic material 140A, the work function metal and dielectric layers 134A and 132A, and an upper portion of the multilayer buffer layer 112, to form a shallow trench 112-1 in the buffer layer 112. The etch process may be implemented using one or more sequential dry etch processes (e.g., RIE) with etch chemistries that are suitable to etch the different materials of the different layers 140A, 134A, 132A, 118, and 116.

Newt, FIG. 8 is a cross-sectional schematic side view of the semiconductor structure of FIG. 7 after depositing a layer of insulating material 150A to fill the shallow trench 112-1 and the opening 140-1 with insulating material. The layer of insulating material 150 may comprise, for example, a conformal SiN liner that is deposited initially to line the sidewalls and bottom surface of the shallow trench 112-1, followed by a blanket deposition of an oxide material such as $SiO_2$ or silicon oxynitride (SiON) to fill the shallow trench 112-1 with insulating oxide material. Thereafter, a planarization process (e.g., chemical mechanical polishing (CMP)) is performed to remove the overburden (excess) insulating/dielectric material from the top surface of the semiconductor structure and planarize the surface of the semiconductor structure down to the upper surface of the metal gate electrodes 140. An oxide recess process is then performed to etch down the insulating material within the opening 140-1 down to a target level is which substantially equal to the upper surface of the third layer 118 of the multilayer buffer 112, resulting in the semiconductor structure shown in FIG. 1A.

Following the formation of the semiconductor structure shown in FIG. 1A, any known sequence of processing steps can be implemented to complete the fabrication of n-type and/or p-type FINFET devices and other elements of a semiconductor integrated circuit being fabricated, the details of which are not needed to understand embodiments of the invention. Briefly, an exemplary process flow is as follows. An insulting material such SiN can be deposited over the semiconductor structure shown in FIG. 1A and patterned to form a hard mask that is used to further pattern the metal gate electrodes 140 and underlying high-k metal gate stack structures 130. After the metal gate electrodes 140 and underlying high-k metal gate stack structures 130 are patterned to form the final gate structures of the FINFET devices, a conformal layer of insulating material such as SiN is deposited and patterned to form insulating gate sidewall spacers on the sidewalls of the gate structures of the FINFET devices, which maintain the remaining portion of the hard mask as gate capping layers.

Following formation of the gate sidewall spacers, source/drain regions are formed on the exposed portions of the vertical semiconductor fins 122 and 124 that extend from the insulating gate sidewall spacers of the gate structures of the FINFET devices. The source/drain regions can be formed using various techniques. For example, in one embodiment, the source/drain regions can be formed by doping the exposed portions of the vertical semiconductor fins 122 and 124 using ion implantation techniques. In particular, the source/drain regions can be formed by doping the exposed portions of the vertical semiconductor fins 122 and 124 with Group III elements (for P-type FINFET devices) or Group V elements (for N-type FINFET devices). Typical dopants include Boron, Arsenic, Phosphorus, Gallium, Antimony, etc. For example, boron is a p-type dopant, whereas phosphorus is an n-type dopant.

In another embodiment of the invention, the source/drain regions can be formed by epitaxy, wherein a III-V compound material, or other suitable compound semiconductor materials are epitaxially grown on the exposed portions of the vertical semiconductor fins 122 and 124. The source/drain regions can be grown epitaxially, and doped during the epitaxy process by adding impurities to the source gas, such as arsine, phosphine or diborane, for example, wherein the concentration of impurity in the gas phase determines the dopant concentration in the deposited film.

Following the formation of the source/drain regions, a layer of insulating material (e.g., PMD (pre-metal dielectric layer)) is deposited and planarized to cover the FINFET devices in the device regions. Via contacts are then formed by etching openings in the PMD layer and in the gate capping layers to expose portions of the source/drain/gate structures of the FINFET devices, and then filling the openings with a conductive material to form the device contacts in the PMD layer. Following formation of the device contacts (e.g., MOL (middle of the line) contacts), an BEOL (back end of line) interconnect structure is formed to provide connections between the FINFET devices and other active or passive devices that are formed as part of the FEOL (front end of the line) layer.

Figure 9:
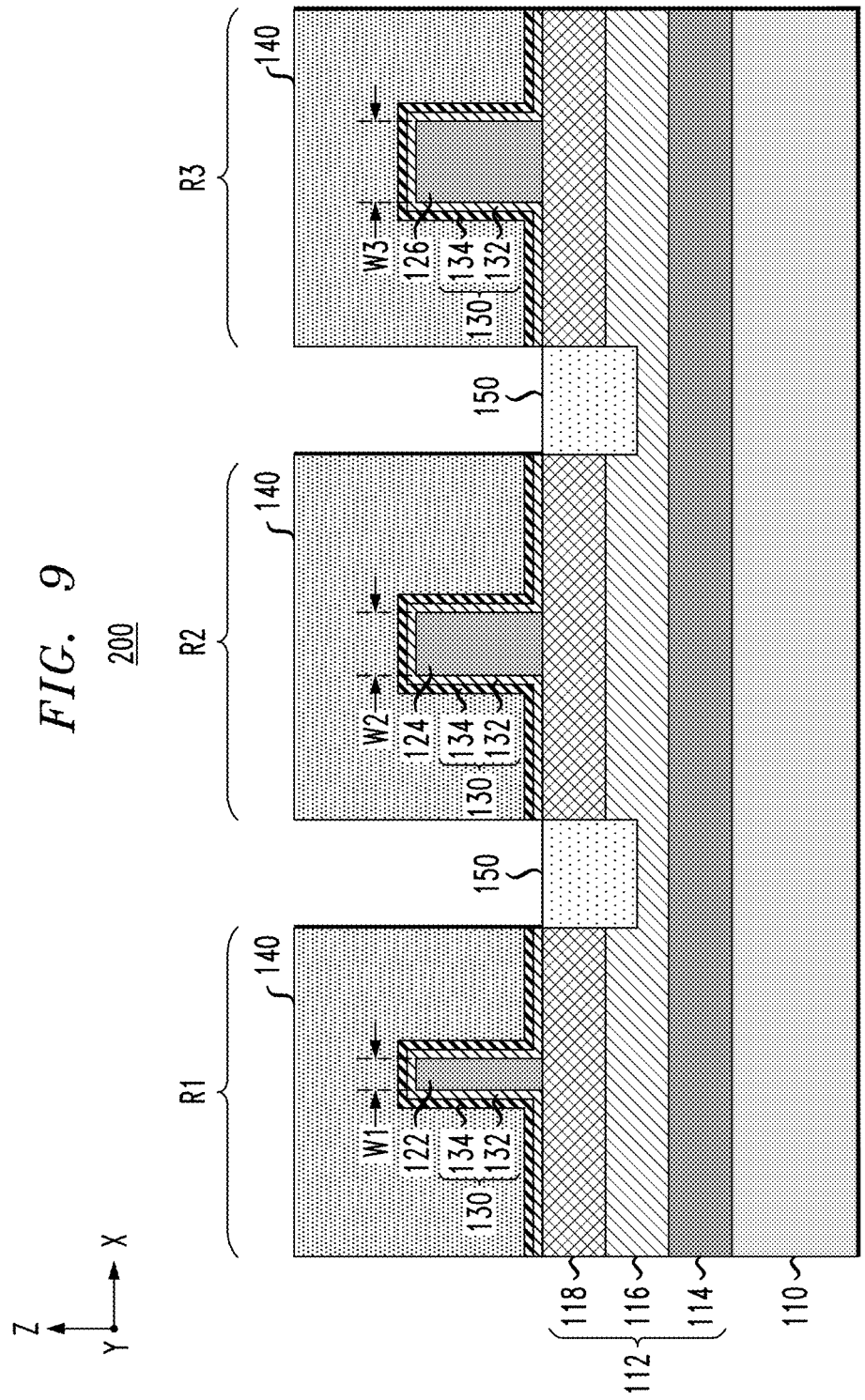
FIG. 9 is a cross-sectional schematic side view of a semiconductor device comprising III-V FINFET devices that are formed with different semiconductor fin widths to obtain different threshold voltages, according to another embodiment of the invention.

While the example embodiments discuss above illustrate a semiconductor device having FINFET devices with vertical semiconductor fins fabricated with two different widths W1 and W2, other embodiments of the invention include FINFET devices with vertical semiconductor fins fabricated with 3 or more different widths. For example, FIG. 9 is a cross-sectional schematic side view of a semiconductor device comprising III-V FINFET devices that are formed with at least three different semiconductor fin widths ($W_F$) to obtain three different threshold voltages, according to another embodiment of the invention. In particular, the semiconductor device 200 shown in FIG. 9 is similar to the semiconductor device 100 shown in FIG. 1A, except that the semiconductor device 200 comprise a third device region R3 having a FINFET device formed with a vertical semiconductor fin 126 having a third width W3.

In one embodiment of the invention, in FIG. 9, the semiconductor fin width ($W_F$) is selected such that W3>W2>W1. For example, W1 is about 3 nm, W2 is about 3.5 nm and W3 is about 4 nm. The FINFET device(s) in the first device region R1 having the semiconductor fin width W1 are optimized for low power operation, wherein the fin width W1=3.0 nm provides a voltage threshold Vt of about 0.25V. Further, the FINFET device(s) in the second device region R2 having the semiconductor fin width W2 are optimized for standard operation, wherein the fin width W2=3.5 nm provides a Vt of about 0.15V. Moreover, the FINFET device(s) in the third device region R3 having the semiconductor fin width W3 are optimized for high-performance operation, wherein the fin width W3=4.0 nm provides a Vt of about 0.1V. It is to be understood that the voltage threshold Vt as a function of fin width $W_F$ will vary depending on the type of III-V compound semiconductor material that is used to form the vertical semiconductor fins 122, 124 and 126.

Figure 10:
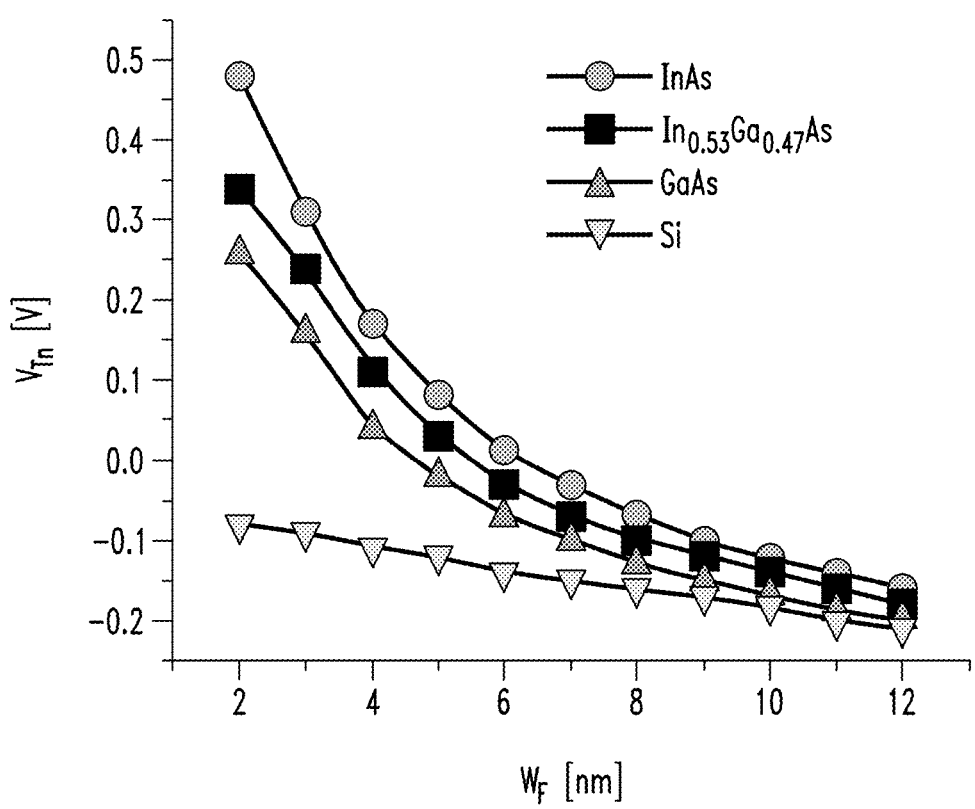
FIG. 10 graphically illustrates threshold voltage as a function of semiconductor fin width for semiconductor fins formed with different semiconductor materials.

FIG. 10 graphically illustrates threshold voltage Vt as a function of semiconductor fin width $W_F$ for semiconductor fins formed of different III-V compound semiconductor materials. In particular, FIG. 10 graphically illustrates the threshold voltage Vt as a function of semiconductor fin width $W_F$ for semiconductor fins formed of InAs, InGaAs, and GaAs compound semiconductor materials. For purposes of comparison, FIG. 10 also shows the threshold voltage Vt as a function of semiconductor fin width $W_F$ for semiconductor fins formed of Si. FIG. 10 graphically illustrates that for the example III-V compound semiconductor materials, the threshold voltage Vt becomes highly sensitive to the semiconductor fin width $W_F$ for widths that are less than 10 nm. In this regard, FIG. 10 shows that in the sub-10 nm range, and more specifically, in the sub-5 nm range, a narrower semiconductor fin provides a higher threshold voltage device, wherein a wider semiconductor fin provides a lower threshold voltage device. This is feasible because of the quantization effects which are higher for III-V materials such as InGaAs as compared to Si. The difference in short-channel effect will be very small due to narrow fin widths to begin with. For narrow fins, it only takes ~0.5 nm to change the threshold voltage by 75 mV.

Embodiments of the invention enable relatively large changes in threshold voltage to be achieved using extremely narrow fins (<5 nm) with a slight change in fin width (<2 nm) to achieve a large change in threshold voltage (>100 mV) for III-V channel materials. These techniques allow for threshold voltage adjustment by inducing quantum confinement. In addition, electrostatics such as drain induced barrier lowering (DIBL) and subthreshold slope remain essentially the same, while only the threshold voltage is shifted.

It is to be understood that the methods discussed herein can be incorporated in various semiconductor process flows to fabricate III-V FINFET devices for integrated circuits with analog and digital circuitry or mixed-signal circuitry. In particular, integrated circuit dies can be fabricated with various additional devices such as bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

The invention claimed is:

1. A semiconductor device, comprising:
   a plurality of vertical semiconductor fins formed on a semiconductor substrate, wherein the plurality of vertical semiconductor fins comprises a first vertical semiconductor fin and a second vertical semiconductor fin, wherein the first and second vertical semiconductor fins are formed of a III-V compound semiconductor material, wherein the first vertical semiconductor fin is patterned to comprise a first width W1 along an entire length of the first vertical semiconductor fin, and wherein the second vertical semiconductor fin is patterned to comprise a second width W2 along an entire length of the second vertical semiconductor fin, wherein W1 is less than W2;
   a first gate structure of a first FINFET device formed over a portion of the first vertical semiconductor fin; and
   a second gate structure of a second FINFET device formed over a portion of the second vertical semiconductor fin;
   wherein the first FINFET device comprises a first threshold voltage and the second FINFET device comprises a second threshold voltage;
   wherein the first threshold voltage is greater than the second threshold voltage as a result of the first width W1 being less than the second width W2.

2. The device of claim 1, wherein the first width W1 and the second width W2 are less than 10 nm.

3. The device of claim 1, wherein the first width W1 is about 3.0 nm or less, and wherein the second width W2 is greater than 3.0 nm and less than 10 nm.

4. The device of claim 1, wherein the first and second vertical semiconductor fins are formed of a composition of InGaAs (indium gallium arsenide).

5. The device of claim 1, wherein the first and second vertical semiconductor fins are patterned from an active semiconductor layer of III-V compound semiconductor material which is epitaxially grown on a buffer layer formed of III-V compound semiconductor material.

6. The device of claim 5, wherein the buffer layer comprises a multilayer stack of III-V compound semiconductor materials, which provides a relaxed graded buffer layer between a base semiconductor substrate and the active semiconductor layer.

7. The device of claim 6, wherein the buffer layer comprises a first layer of III-V compound semiconductor material, a second layer of III-V compound semiconductor material formed on the first layer, and a third layer of III-V compound semiconductor material formed on the second layer, wherein the first, second and third layers of the buffer layer are formed of different III-V compound semiconductor materials.

8. The device of claim 7, wherein the first layer of the buffer layer comprises a composition of GaAs (gallium arsenide), wherein the second layer of the buffer layer comprises a composition of InP (indium phosphide), and wherein the third layer of the buffer layer comprises a composition of InAlAs (indium aluminum arsenide).

9. The device of claim 1, wherein the first and second gate structures each comprise:
   a high-k metal gate stack structure; and a metal gate electrode layer formed over the high-k metal gate stack structure.

10. The device of claim 1, further comprising:
a buffer layer formed on the semiconductor substrate; and
an active semiconductor layer of III-V compound semiconductor material formed on the buffer layer;
wherein the first and second vertical semiconductor fins are patterned from the active semiconductor layer of III-V compound semiconductor material.

11. The device of claim 1, wherein the plurality of vertical semiconductor fins further comprises a third vertical semiconductor tin, wherein the third vertical semiconductor fin is formed of a III-V compound semiconductor material, and wherein the third vertical semiconductor fin is patterned to comprise a third width W3 along an entire length of the third vertical semiconductor fin, wherein W3 is greater than W1 and W2.

12. The device of claim 11, wherein each of W1, W2, and W3 are less than 10 nm.

* * * * *